(12) United States Patent
Nowak et al.

(10) Patent No.: US 7,453,084 B2
(45) Date of Patent: Nov. 18, 2008

(54) SPIN TRANSISTOR WITH ULTRA-LOW ENERGY BASE-COLLECTOR BARRIER

(75) Inventors: Janusz J. Nowak, Mahopac, NY (US); Brian W. Karr, Savage, MN (US); David H. Olson, St. Paul, MN (US); Eric S. Linville, Chanhassen, MN (US); Paul E. Anderson, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 188 days.

(21) Appl. No.: 11/136,282

(22) Filed: May 24, 2005

(65) Prior Publication Data

US 2006/0267145 A1 Nov. 30, 2006

(51) Int. Cl.
*H01L 43/00* (2006.01)
(52) U.S. Cl. .................. 257/30; 257/295; 257/423; 257/E43.004; 977/935
(58) Field of Classification Search .............. 257/30
See application file for complete search history.

(56) References Cited

U.S. PATENT DOCUMENTS

| | | | |
|---|---|---|---|
| 5,747,859 A | | 5/1998 | Mizushima et al. |
| 5,757,056 A | * | 5/1998 | Chui ........................... 257/421 |
| 5,835,314 A | * | 11/1998 | Moodera et al. ......... 360/324.2 |
| 5,973,334 A | | 10/1999 | Mizushima et al. |
| 6,069,820 A | * | 5/2000 | Inomata et al. ............. 365/171 |
| 6,218,718 B1 | | 4/2001 | Gregg et al. |
| 6,219,274 B1 | | 4/2001 | Shimazawa et al. |
| 6,445,024 B1 | * | 9/2002 | Kwon et al. ................. 257/295 |
| 2002/0097535 A1 | | 7/2002 | Ito et al. |
| 2003/0179510 A1 | | 9/2003 | Hayakawa |

OTHER PUBLICATIONS

The Spin-Valve Transistor, P. S. Anil Kumar and J.C. Lodder, *J. Phys. D: Appl. Phys.* 33 (2000) 2911-2920, IOP Publishin Ltd.
Spin Valve Transistor with an Fe/Au/Fe(001) Base, R. Sato and K. Mizushima, *Applied Physics Letters*, vol. 79, No. 8, Aug. 20, 2001, American Institute of Physics.
Giant Magnetocurrent Exceeding 3400% in Magnetic Tunnel Transistors with Spin-Valve Base Layers, Sebastiaan van Dijken, Xin Jiang, and Stuart S.P. Parkin, *Applied Physics Letters*, vol. 83, No. 5, Aug. 4, 2003, American Institute of Physics.
Room Temperature-Operating Spin-Valve Transistors Formed by Vacuum Bonding, D.J. Monsma, R. Vlutters, J.C. Lodder, www.sciencemag.org, Science vol. 281, pp. 407-409, Jul. 17, 1998.
The Spin-Valve Transistor: a View and Outlook, *Journal of Physics D: Applied Physics*, 36 (2003) R289-R308, IOP Publishing Ltd.
Luminescent Spin-Valve Transistor, *Applied Physics Letters*, Vo. 83, No. 22, Dec. 1, 2003.
A Spin Metal-Oxide-Semiconductor Field-Effect Transistor Using Half-Metallic-Ferromagnet Contacts for the Source and Drain, *Applied Physics Letters*, vol. 84, No. 13, Mar. 29, 2004.

* cited by examiner

*Primary Examiner*—Jerome Jackson, Jr.
(74) *Attorney, Agent, or Firm*—Kinney & Lange, P.A.

(57) ABSTRACT

A transistor has an emitter, a spin-selective base, a collector, a first barrier interposed between the spin-selective base and the emitter, a second barrier interposed between the spin-selective base and the collector, and a transfer ratio of more than $10^{-3}$.

20 Claims, 2 Drawing Sheets

SPIN TRANSISTOR WITH ULTRA-LOW ENERGY BASE-COLLECTOR BARRIER

FIELD OF THE INVENTION

This invention relates to a transistor with an ultra-low energy barrier between the base and collector.

BACKGROUND OF THE INVENTION

Magnetic tunneling transistor (MTT) devices have been developed to improve the performance of magnetic sensors. MTT devices evolved from earlier spin valve transistor (SVT) devices.

A SVT device is a three terminal device that is described using the emitter, base and collector nomenclature of the bipolar junction transistor (BJT). However, unlike a BJT, in which all three layers are made of semiconductors, a SVT typically consists of a semiconductor emitter, a multi-layered metallic base, and a semiconductor collector. Because the emitter and collector are made of a semiconducting material, while the base is made of a metallic material, Schottky barriers are formed at the emitter-base junction and the base-collector junction. These Schottky barriers prevent electrons at the Fermi level from traveling through the structure. Materials are selected so that the Schottky barrier between the emitter and the base is higher in energy than the Schottky barrier between the base and the collector. A typical emitter-base Schottky barrier height is 1 to 2 electron-volts (eV), while a typical base-collector Schottky barrier height is 0.5 eV.

In the operation of a SVT device, a current is established between the emitter and base, such that electrons are injected into the base perpendicular to the layers of the SVT. Since the electrons must overcome the emitter-base Schottky barrier, the electrons enter the base as non-equilibrium or "hot" electrons. The energy of these hot electrons is determined by the height of the Schottky barrier between the emitter and the base.

The base region of a SVT filters the hot electrons according to their spin. The base region usually has three layers: a fixed ferromagnetic layer with a fixed magnetic orientation, a free ferromagnetic layer with a magnetic orientation that is free to rotate in the presence of a magnetic field, and a non-magnetic metal layer separating the fixed and free ferromagnetic layers. The fixed ferromagnetic layer filters electrons according to their spin. It allows electrons with one spin orientation (up or down) to pass through it, but prohibits transport of electrons with the opposite spin. The free ferromagnetic layer will change its orientation in the presence of a magnetic field. It will allow electrons with one spin orientation to pass through it, while prohibiting electrons with the other spin orientation from passing through it. If the free ferromagnetic layer has the same magnetic orientation as the fixed ferromagnetic layer, both ferromagnetic layers will allow electrons with a certain spin orientation to pass through. Therefore, electrons will be able to flow through the base to the Schottky barrier between the base and the collector. However, if the free ferromagnetic layer has the opposite magnetic orientation of the fixed ferromagnetic layer, the two layers will each filter electrons with different spins. As a result, electrons will not be able to traverse the base.

Thus, the presence of a magnetic field results in the SVT having one of two states. If the magnetic field that is present has one orientation, current will flow through the base. If the magnetic field that is present has the opposite orientation, current will not flow through the base.

As the hot electrons traverse the base, they are subject to scattering, which changes both their energy and momentum distributions. A hot electron is only able to enter the collector if its momentum matches one of the available states in the collector. In addition, hot electrons are only able to enter the collector if they have retained sufficient energy to overcome the base-collector Schottky barrier, which is chosen to be somewhat lower than the emitter-base Schottky barrier. This creates a significant limitation on the device. Because the amount of electron scattering increases with the distance the electrons travel, in order for the hot electrons to retain sufficient energy to pass over the second Schottky barrier, the base region must be thin. Since the base is composed of multiple layers of metal, this presents practical problems.

A voltage between the base and collector does not affect the hot electron current of the SVT because a voltage does not significantly change the maximum of the Schottky barrier when measured with respect to the Fermi energy. Similarly, a change in the emitter-base voltage does not affect the energy at which the hot electrons are injected into the base, because the applied voltage hardly modifies the maximum of the emitter-base energy barrier. As a result, the collector current in a SVT device is linearly proportional to the emitter current.

The MTT evolved from the SVT and is sometimes referred to as the tunnel SVT. The MTT differs in structure from the SVT in that the emitter of the MTT is made of metal. Therefore, no Schottky barrier is formed between the emitter and the base. In place of the Schottky barrier, a tunneling barrier prevents low energy electrons from traveling from the emitter to the base. The base and the collector of the MTT have the same structure as the SVT, so a Schottky barrier exists between the base and the collector. Like SVT devices, MTT devices are designed so that the tunneling barrier is higher in energy than the Schottky barrier at the base-collector junction.

The MTT, like the SVT, is a hot carrier device. However, because the emitter-base junction of the MTT has a tunneling barrier instead of a Schottky barrier, one notable difference between the MTT and the SVT is that the energy of the barrier between the emitter and the base is much more strongly affected than a Schottky barrier by the voltage applied between the emitter and the base. This means that the energy of the hot electrons that are able to pass the tunneling barrier may be adjusted over a certain range of energies. Raising the hot electron energy increases the ratio of the collector current over the emitter current. This results in the MTT having a larger collector current than a comparable SVT.

While the MTT demonstrates improved performance over the SVT, most notably in the larger collector current of the MTT, its performance is still insufficient for many uses. The collector-emitter current ratio, or transfer ratio, of MTT devices is typically of the order $10^{-3}$, which is insufficient magnetocurrent for industrial applications. In addition, the presence of a collector made of a single-crystal semiconductor material prevents the practical use of MTT devices for many applications, such as recording heads.

Therefore, to improve the performance of MTT devices and utilize them in applications such as magnetic sensors in a recording head, it is desirable to create MTTs with larger collector-emitter current ratios. It is also desirable to create MTTs that do not require single-crystal semiconductors.

BRIEF SUMMARY OF THE INVENTION

The present invention provides a transistor that has an emitter, a spin-selective base, a collector, a first barrier interposed between the spin-selective base and the emitter, a second barrier interposed between the spin-selective base and the collector and having a transfer ratio of more than $10^{-3}$. The present invention also provides a transistor that has an emitter, a spin-selective base, a collector, a first barrier interposed between the spin-selective base and the emitter, a second barrier interposed between the spin-selective base and the collector and having a second barrier energy of less than 500 millielectronvolts. The present invention also provides a transistor that has an emitter, a spin-selective base, a collector, a first barrier interposed between the spin-selective base and the emitter, a second barrier interposed between the spin-selective base and the collector and having a second barrier thickness of less than 20 angstroms.

DETAILED DESCRIPTION

Figure 1:
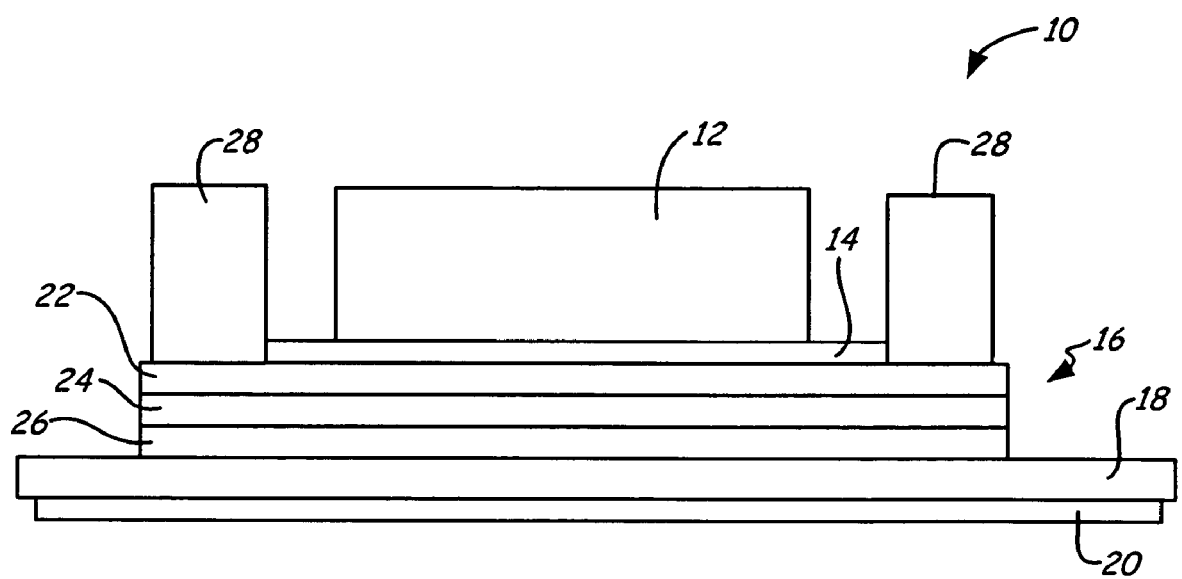
FIG. 1 shows a transistor with a barrier between the base and collector according to an embodiment of the invention.

FIG. 1 is a cross-sectional view of transistor 10, which includes emitter 12, emitter-base barrier 14, base 16, base-collector barrier 18, and collector 20. Emitter-base barrier 14 separates emitter 12 and base 16 and creates an energy barrier that is sufficiently high so that only hot electrons from the emitter having sufficient energy to transport through emitter-base barrier 14 will flow into base 16. Typically, emitter-base barrier 14 is made of a metal oxide, such as aluminum oxide, and has a barrier energy of about 0.5 to about 5 eV. Emitter 12 and collector 20 are made of metal.

Base 16 includes fixed ferromagnetic layer 22, metal layer 24, free ferromagnetic layer 26, and base contacts 28. Fixed ferromagnetic layer 22 has a fixed magnetic orientation. When a voltage is applied across emitter 12 and base 16 of transistor 10, hot electrons are ejected from emitter 14, transport through emitter-base barrier 14, and flow into fixed ferromagnetic layer 22. Because fixed ferromagnetic layer 22 has a fixed magnetic orientation, only electrons with a certain spin, either up or down, will be able to filter through fixed ferromagnetic layer 22. The spin filtered electrons flow from fixed ferromagnetic layer 22, through metal layer 24, and into free ferromagnetic layer 26.

Free ferromagnetic layer 26 has a magnetic orientation that will vary depending upon the orientation of a magnetic field that is in the presence of transistor 10. If the magnetic orientation of free ferromagnetic layer 26 is the same as fixed ferromagnetic layer 22, electrons will be conducted through free ferromagnetic layer 26, traversing the base region to reach base-collector barrier 18. Base-collector barrier 18 has a lower barrier energy than emitter-base barrier 14. Spin filtered electrons that pass through base 16 and have sufficient energy to transport through collector barrier 18 will reach collector 20. However, if free ferromagnetic layer 26 has the opposite magnetic orientation from fixed ferromagnetic layer 22, spin-filtered electrons passing through fixed ferromagnetic layer 22 will not be able to pass through free ferromagnetic layer 26. Therefore, no significant current will reach collector 20.

Base-collector barrier 18 is made of a material that creates a relatively low energy barrier. A typical barrier according to the invention will be less than 20 angstroms (Å) thick and will have a barrier energy of about 50 to about 500 millielectronvolts (meV). For example, a titanium oxide barrier after annealing at 250° C. for 4 hours is approximately 8 Å thick and has a barrier energy of about 100 meV. Electrons having energy greater than the barrier energy will be transported to the collector. As a result, the transfer ratio between collector and emitter currents will be much larger in this device than the $10^{-6}$ to $10^{-3}$ achieved in conventional magnetic tunneling transistors, where a typical Schottky barrier is 30 to 300 Å thick and has a barrier energy of 500 meV.

The barrier energy of tunneling barriers can be altered both by the thickness of the layer and by the voltage applied across the barrier. Some typical barrier energies according to the invention are about 50 meV to about 150 meV, about 25 meV to about 250 meV, about 10 meV to about 400 meV, about 400 meV, and about 500 meV. A titanium oxide barrier such as the one described in the preceding paragraph could be adjusted from 0 eV to more than 10 eV.

The barrier thickness of a titanium oxide barrier could range from essentially 0 Å to many hundreds of angstroms. Some typical barrier thicknesses according to the invention are 10 Å or less, about 5 Å to about 20 Å, about 2 Å to about 25 Å, and 20 Å or less. While metal oxide barriers are used in this embodiment of the invention, persons skilled in the art will realize that any material meeting the specification for barrier energy and layer thickness could be used in this device. Appropriate materials include metals, oxides, nitrides, carbides, peroskites, and wide band-gap and narrow band-gap semiconductors.

Figure 2:
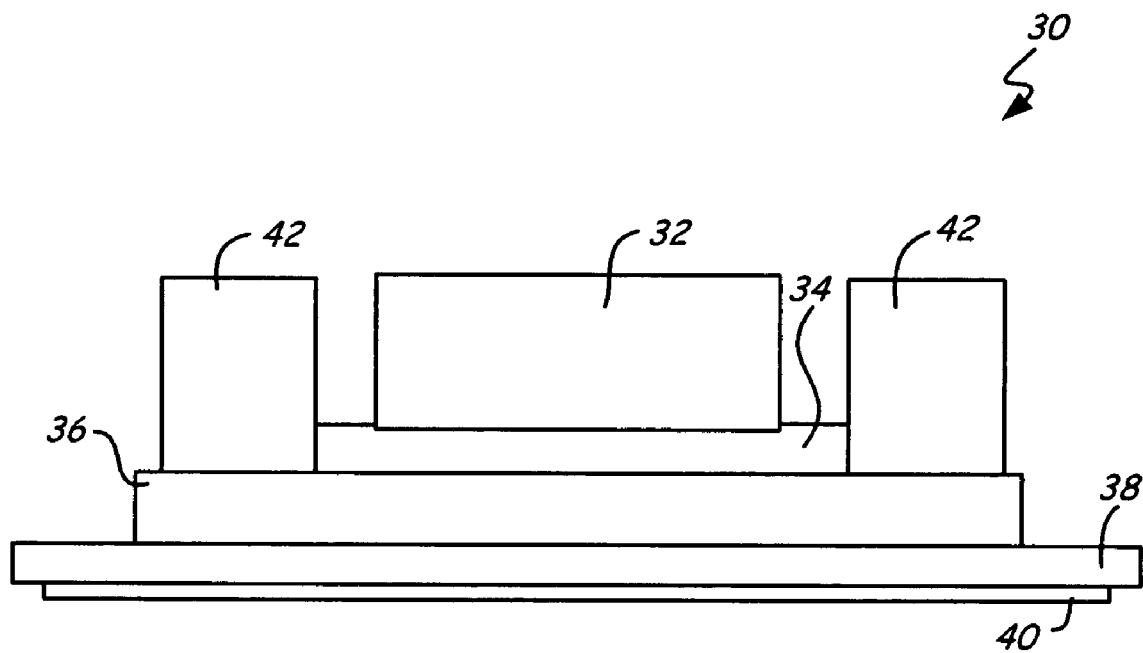
FIG. 2 shows a transistor with a magnetic emitter and a barrier between the base and collector according to another embodiment of the invention.

FIG. 2 illustrates another embodiment of the invention. Transistor 30 includes magnetic emitter 32, emitter-base barrier 34, base 36, base-collector barrier 38, collector 40 and base contacts 42. When a voltage is applied across magnetic emitter 32 and base region 36 of transistor 30, hot electrons from emitter 32 will transport through emitter-base barrier 34. However, since emitter 32 is magnetic, these hot electrons will have the same spin. Thus, the hot electrons that enter base 36 will already be spin-filtered.

The spin-filtered electrons that transport through emitter-base barrier 34 reach base 36. The magnetic orientation of base 36 depends on the orientation of the magnetic field that is present. If the magnetic orientation of base 36 is the opposite of the orientation of the spin-filtered electrons that transport through emitter-base barrier 34, electrons will not be able to pass through base 36, and current will not flow into collector 40. However, if the magnetic orientation of base 36 is the same as the spin-filtered electrons that transport through emitter-base barrier 34, the electrons will be able to transport through base 36 and current will flow.

Base-collector barrier 38 is a barrier with a relatively low energy. The hot electrons that pass through base 36 and that have sufficient energy to transport through base-collector barrier 38 will flow into collector 40. Because base-collector barrier 38 is lower in energy than prior art devices, a much larger collector current is exhibited by transistor 30 than in prior art devices. Base-collector barrier 38 may be made of any of the same materials as base-collector barrier 18 and will have the same range of layer thickness and barrier energy as base-collector barrier 18.

While FIGS. 1 and 2 show two configurations that are the most likely to be used in practice by virtue of their simplicity, any combination of energy and spin filters is possible. In addition, one can utilize ferromagnetic materials with different coercivities, such as Co, CoPt, and CoFe hard magnets. Half-metals, such as $Fe_3O_4$, may also be used to spin filter electrons. Furthermore, a synthetic anti-ferromagnetic (SAF) or a synthetic anti-ferromagnetic/anti-ferromagnetic (SAF/AF) layer to improve spin filtering by pinning the magnetic alignment of one of ferromagnets may also be used.

This ultra low barrier device can be utilized in applications that utilize magnetic transistor sensors, such as recording heads or differential sensors. A transistor with a barrier between the base and collector according to the present invention results in substantially higher emitter to collector current ratios, and thus improves the performance of the device. In addition, use of a barrier between the base and collector does not require the use of a single-crystal semiconductor for the collector, thus allowing the device to be used in applications in which it is not practicable to utilize single crystal semiconductors.

Although the present invention has been described with reference to preferred embodiments, workers skilled in the art will recognize that changes may be made in form and detail without departing from the spirit and scope of the invention.

The invention claimed is:

1. A transistor comprising:
   a metal emitter;
   a spin-selective base comprising a fixed magnetic layer, a free magnetic layer, and a non-magnetic layer interposed between the fixed magnetic layer and the free magnetic layer;
   a metal collector;
   a first tunneling barrier interposed between the spin-selective base and the metal emitter; and
   a second tunneling barrier interposed between the spin-selective base and the metal collector, such that the transistor has a transfer ratio of more than $10^{-3}$.

2. The transistor of claim 1 wherein the second tunneling barrier comprises at least one of metals, oxides, nitrides, carbides, perovskites, wide band-gap semiconductors, and narrow band-gap semiconductors.

3. The transistor of claim 2 wherein the second tunneling barrier comprises titanium oxide.

4. The transistor of claim 1 wherein the first tunneling barrier has a first barrier energy, the second tunneling barrier has a second barrier energy, and the first barrier energy is higher than the second barrier energy.

5. The transistor of claim 1 wherein the spin selective base further comprises a synthetic anti-ferromagnetic layer adjacent to the fixed magnetic layer.

6. A transistor comprising:
   a metal emitter;
   a spin-selective base comprising a fixed magnetic layer, a free magnetic layer, and a non-magnetic layer interposed between the fixed magnetic layer and the free magnetic layer;
   a metal collector;
   a first tunneling barrier having a first barrier energy and interposed between the spin-selective base and the metal emitter; and
   a second tunneling barrier interposed between the spin-selective base and the metal collector and having a second barrier energy less than 500 meV, such that the transistor has a transfer ratio larger than $10^{-3}$.

7. The transistor of claim 6 wherein the second tunneling barrier comprises at least one of metals, oxides, nitrides, carbides, perovskites, wide band-gap semiconductors, and narrow band-gap semiconductors.

8. The transistor of claim 6 wherein the second tunneling barrier comprises titanium oxide.

9. The transistor of claim 6 wherein the first barrier energy is greater than the second barrier energy.

10. A transistor comprising:
    a metal emitter;
    a spin-selective base comprising a fixed magnetic layer, a free magnetic layer, and a non-magnetic layer interposed between the fixed magnetic layer and the free magnetic layer;
    a metal collector;
    a first tunneling barrier interposed between the spin-selective base and the emitter; and
    a second tunneling barrier interposed between the spin-selective base and the metal collector and having a thickness of 10 angstroms or less, such that the transistor has a transfer ratio larger than $10^{-3}$.

11. The transistor of claim 10 wherein the second tunneling barrier comprises at least one of metals, oxides, nitrides, carbides, perovskites, wide band-gap semiconductors, and narrow band-gap semiconductors.

12. The transistor of claim 11 wherein the second tunneling barrier comprises titanium oxide.

13. The transistor of claim 10 wherein the first tunneling barrier has a first barrier energy, the second tunneling barrier has a second barrier energy, and the first barrier energy is higher than the second barrier energy.

14. The transistor of claim 4 wherein the second barrier energy is about 500 meV or less.

15. The transistor of claim 4 wherein the second barrier energy is about 250 meV or less.

16. The transistor of claim 4 wherein the second tunneling barrier has a thickness of less than 10 angstroms.

17. The transistor of claim 6 wherein the second barrier energy is about 150 meV or less.

18. The transistor of claim 17 wherein the second tunneling barrier has a thickness between about 2 angstroms and about 10 angstroms.

19. The transistor of claim 13 wherein the second barrier energy is about 100 meV or less.

20. The transistor of claim 19 wherein the thickness of the second tunneling barrier is about 8 angstroms or less.

* * * * *